(12) United States Patent
Tung et al.

(10) Patent No.: US 9,679,882 B2
(45) Date of Patent: Jun. 13, 2017

(54) METHOD OF MULTI-CHIP WAFER LEVEL PACKAGING

(71) Applicant: Taiwan Semiconductor Manufacturing Company, Ltd., Hsin-Chu (TW)

(72) Inventors: Chih-Hang Tung, Hsin-Chu (TW); Chun Hui Yu, Zhubei (TW); Chen-Hua Yu, Hsin-Chu (TW); Da-Yuan Shih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/013,669

(22) Filed: Feb. 2, 2016

(65) Prior Publication Data
US 2016/0155731 A1    Jun. 2, 2016

Related U.S. Application Data

(62) Division of application No. 13/206,602, filed on Aug. 10, 2011, now abandoned.

(51) Int. Cl.
*H01L 21/00* (2006.01)
*H01L 25/00* (2006.01)
(Continued)

(52) U.S. Cl.
CPC .......... *H01L 25/50* (2013.01); *H01L 21/4882* (2013.01); *H01L 21/561* (2013.01); *H01L 21/563* (2013.01); *H01L 21/76879* (2013.01); *H01L 21/78* (2013.01); *H01L 23/3114* (2013.01); *H01L 24/03* (2013.01); *H01L 24/09* (2013.01); *H01L 24/11* (2013.01);
(Continued)

(58) Field of Classification Search
CPC . H01L 24/19; H01L 25/0657; H01L 23/3128; H01L 23/5389; H01L 23/3114; H01L 21/561; H01L 25/50; H01L 24/24; H01L 24/94; H01L 24/97; H01L 21/563; H01L 21/56; H01L 2224/32145; H01L 2224/95; H01L 2224/16145; H01L 2224/1146; H01L 2224/11462; H01L 2224/11464
See application file for complete search history.

(56) References Cited

U.S. PATENT DOCUMENTS

| 4,811,082 A | 3/1989 | Jacobs et al. |
| 4,990,462 A | 2/1991 | Sliwa |

(Continued)

*Primary Examiner* — Khiem D Nguyen
(74) *Attorney, Agent, or Firm* — Slater Matsil, LLP

(57) ABSTRACT

A method of multi-chip wafer level packaging comprises attaching a first semiconductor die to a top side of a wafer, forming a first reconfigured wafer by embedding the first semiconductor die into a first photo-sensitive material layer, forming a first group of through assembly vias in the first photo-sensitive material layer, attaching a second semiconductor die to the first photo-sensitive material layer, forming a second photo-sensitive material layer on top of the first photo-sensitive material layer, wherein the second semiconductor die is embedded in the second photo-sensitive material layer and forming a second group of through assembly vias in the second photo-sensitive material layer.

20 Claims, 23 Drawing Sheets

(51) Int. Cl.
*H01L 23/31* (2006.01)
*H01L 21/56* (2006.01)
*H01L 23/00* (2006.01)
*H01L 25/065* (2006.01)
*H01L 21/48* (2006.01)
*H01L 21/768* (2006.01)
*H01L 21/78* (2006.01)

(52) U.S. Cl.
CPC .............. *H01L 24/17* (2013.01); *H01L 24/19* (2013.01); *H01L 24/24* (2013.01); *H01L 24/27* (2013.01); *H01L 24/33* (2013.01); *H01L 24/94* (2013.01); *H01L 24/97* (2013.01); *H01L 25/0657* (2013.01); *H01L 24/32* (2013.01); *H01L 24/73* (2013.01); *H01L 2224/02311* (2013.01); *H01L 2224/02381* (2013.01); *H01L 2224/0346* (2013.01); *H01L 2224/0401* (2013.01); *H01L 2224/04105* (2013.01); *H01L 2224/05572* (2013.01); *H01L 2224/08146* (2013.01); *H01L 2224/12105* (2013.01); *H01L 2224/24145* (2013.01); *H01L 2224/32145* (2013.01); *H01L 2224/32225* (2013.01); *H01L 2224/73217* (2013.01); *H01L 2224/73267* (2013.01); *H01L 2224/8203* (2013.01); *H01L 2224/94* (2013.01); *H01L 2224/97* (2013.01); *H01L 2225/06524* (2013.01); *H01L 2225/06548* (2013.01); *H01L 2225/06568* (2013.01); *H01L 2225/06589* (2013.01); *H01L 2924/00014* (2013.01); *H01L 2924/01029* (2013.01)

(56) References Cited

U.S. PATENT DOCUMENTS

| | | | |
|---|---|---|---|
| 5,075,253 A | 12/1991 | Sliwa | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,185,426 B1 * | 3/2007 | Hiner .................. | H01L 21/4857 257/687 |
| 7,215,033 B2 | 5/2007 | Lee et al. | |
| 7,224,054 B2 * | 5/2007 | Shibata ................. | H01L 23/055 257/673 |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,550,857 B1 | 6/2009 | Longo et al. | |
| 7,557,597 B2 | 7/2009 | Anderson et al. | |
| 7,576,435 B2 | 8/2009 | Chao | |
| 7,625,254 B2 | 12/2009 | Zhang et al. | |
| 7,671,457 B1 | 3/2010 | Hiner et al. | |
| 7,807,512 B2 | 10/2010 | Lee et al. | |
| 7,834,450 B2 | 11/2010 | Kang | |
| 8,076,184 B1 | 12/2011 | Camacho et al. | |
| 2004/0212080 A1 * | 10/2004 | Chen ................... | H01L 23/4334 257/712 |
| 2005/0001329 A1 | 1/2005 | Matsuki et al. | |
| 2005/0017346 A1 * | 1/2005 | Yamagata ......... | H01L 23/49816 257/701 |
| 2005/0046002 A1 * | 3/2005 | Lee ................... | H01L 21/76898 257/678 |
| 2006/0170098 A1 | 8/2006 | Hsu | |
| 2008/0136004 A1 | 6/2008 | Yang et al. | |
| 2008/0174008 A1 | 7/2008 | Yang et al. | |
| 2008/0246126 A1 * | 10/2008 | Bowles ............... | H01L 23/3114 257/659 |
| 2009/0239336 A1 | 9/2009 | Lee et al. | |
| 2010/0155920 A1 | 6/2010 | Lee | |
| 2010/0193932 A1 | 8/2010 | Kang et al. | |
| 2010/0244239 A1 | 9/2010 | Bao et al. | |
| 2012/0217629 A1 | 8/2012 | Cho et al. | |

* cited by examiner

METHOD OF MULTI-CHIP WAFER LEVEL PACKAGING

This application is a divisional of U.S. patent application Ser. No. 13/206,602, entitled "Method of Multi-Chip Wafer Level Packaging," filed on Aug. 10, 2011, abandoned which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, multi-chip wafer level package based semiconductor devices have emerged as an effective alternative to further reduce the physical size of a semiconductor chip. In a wafer level package based semiconductor device, active circuits such as logic, memory, processor circuits and the like are fabricated on different wafers and each wafer die is stacked on top of another wafer die using pick-and-place techniques. Much higher density can be achieved by employing multi-chip semiconductor devices. Furthermore, multi-chip semiconductor devices can achieve smaller form factors, cost-effectiveness, increased performance and lower power consumption.

A multi-chip semiconductor device may comprise a top active circuit layer, a bottom active circuit layer and a plurality of inter-layers. In a multi-chip semiconductor device, two dies may be bonded together through a plurality of micro bumps and electrically coupled to each other through a plurality of through-silicon vias. The micro bumps and through-silicon vias provide an electrical interconnection in the vertical axis of the multi-chip semiconductor device. As a result, the signal paths between two semiconductor dies are shorter than those in a traditional multi-chip device in which different dies are bonded together using interconnection technologies such as wire bonding based chip stacking packages. A multi-chip semiconductor device may comprise a variety of semiconductor dies stacked together. The multiple semiconductor dies are packaged before the wafer has been diced. The wafer level package technology has some advantages. One advantageous feature of packaging multiple semiconductor dies at the wafer level is multi-chip wafer level package techniques may reduce fabrication costs. Another advantageous feature of wafer level package based multi-chip semiconductor devices is that parasitic losses are reduced by employing micro bumps and through-silicon vias.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present disclosure will be described with respect to embodiments in a specific context, a multi-chip wafer level semiconductor package. The embodiments may also be applied, however, to a variety of semiconductor devices.

Figure 1:
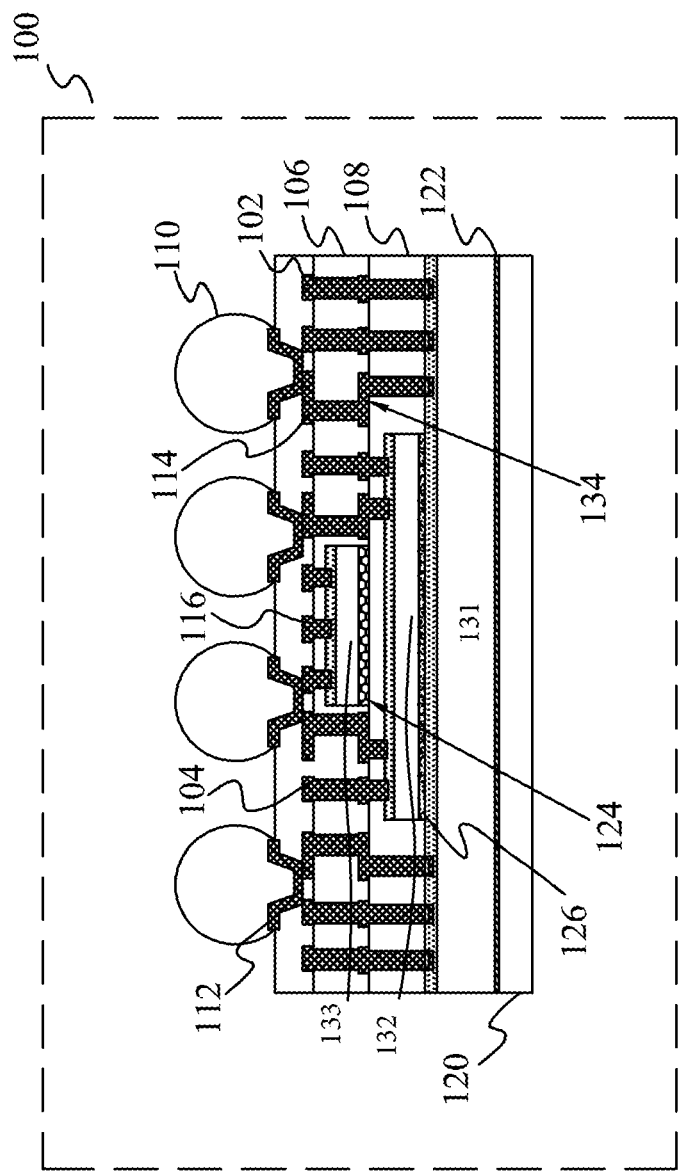
FIG. 1 illustrates a cross sectional view of a multi-chip semiconductor device in accordance with an embodiment.

Referring initially to FIG. 1, a cross sectional view of a multi-chip semiconductor device is illustrated in accordance with an embodiment. The multi-chip semiconductor device 100 comprises a first semiconductor die 131, a second semiconductor die 132 and a third semiconductor die 133. As shown in FIG. 1, the first semiconductor die 131, the second semiconductor die 132 and the third semiconductor die 133 are stacked together to form the multi-chip semiconductor device 100. More particularly, the backside of the second semiconductor die 132 is attached to the front side of the first semiconductor die 131 using a first adhesive layer 126. Likewise, the backside of the third semiconductor die 133 is attached to a photo-sensitive material layer 108 using a second adhesive layer 124.

The multi-chip semiconductor device 100 further comprises a plurality of solder balls 110 as input/output (I/O) pads mounted on the top side of the multi-chip semiconductor device 100 using a plurality of under bump metallization (UBM) structures 112. In order to give a basic insight of the inventive aspects of various embodiments, the first semiconductor die 131, the second semiconductor die 132 and the third semiconductor die 133 are drawn without details. However, it should be noted the first semiconductor die 131, the second semiconductor die 132 and the third semiconductor die 133 may comprise basic semiconductor layers such as active circuit layers, substrate layers, inter-layer dielectric (ILD) layers and inter-metal dielectric (IMD) layers (not shown).

In accordance with an embodiment, the first semiconductor die 131 may comprise a plurality of logic circuits such as central processing unit (CPU), graphics processing unit (GPU) and the like. the second semiconductor die 132 and the third semiconductor die 133 may comprise a plurality of memory circuits such as static random access memory (SRAM) and dynamic random access memory (DRAM) and the like. It should be noted that the first semiconductor die 131, the second semiconductor die 132 and the third semiconductor die 133 may have many embodiments, which are also in the scope of the present disclosure.

The multi-chip semiconductor device 100 may comprise two photo-sensitive material layers 106 and 108. The photo-sensitive material layer 106 is formed on top of the photo-sensitive material layer 108. As shown in FIG. 1, the second semiconductor die 132 is embedded in the photo-sensitive material layer 108. The third semiconductor die 133 is embedded in the photo-sensitive material layer 106. The photo-sensitive material layer 106 may further comprise a plurality of through assembly vias (TAVs) 102, 104 and 116. It should be noted, as shown in FIG. 1, both the TAVs 104 and the TAVs 116 are formed in the photo-sensitive material layer 106. However, the TAVs 116 are formed between the third semiconductor die 133 and the sold ball side of the multi-chip semiconductor device 100. In contrast, the TAVs 104 are formed through the photo-sensitive material layer 106 and further connected to a second redistribution layer 134 formed on top of the photo-sensitive material layer 108. Likewise, the TAVs 102 are formed through the photo-sensitive material layer 106 and further connected to TAVs formed in the photo-sensitive material layer 108. The formation processes of the photo-sensitive material layers 106, 108 and respective TAVs in each layer will be described in detail with respect to FIGS. 2-4.

The active circuit layer (not shown) of the first semiconductor die 131 is coupled to the solder balls 110 through the plurality of TAVs 102, 104 and redistribution layers 114 and 134. More particularly, the second redistribution layer 134, the TAVs 102, the TAVs 104 and the first redistribution layer 114 may form various connection paths so that the active circuits of the first semiconductor die 131 can be connected with the solder balls 110. Likewise, the first redistribution layer 114, the second redistribution layer 134 and the TAVs 104, 116 may form various connection paths so that the active circuit (not shown) of the second semiconductor die 132 and the third semiconductor die 133 can be connected with the solder balls 110.

The multi-chip semiconductor device 100 may comprise a base plane 120 formed on the backside of the first semiconductor die 131. The base plane 120 may be formed of a conductive material such as copper, sliver, gold, tungsten, aluminum, combinations thereof or the like. Alternatively, the base plane 120 may be formed of a wide variety of materials comprising glass, silicon, ceramics, polymers and the like. In accordance with an embodiment, the base plane 120 may be adhered on the backside of the semiconductor die 131 by an adhesive 122, such as thermal interface materials including epoxy and the like.

As shown in FIG. 1, the base plane 120 is formed directly adjacent to the first semiconductor die 131. Consequently, the base plane 120 may help to dissipate the heat generated from the first semiconductor die 131. As a result, the base plane 120 may help to reduce the junction temperature of the first semiconductor die 131. In comparison with a semiconductor die not having a base plane, the first semiconductor die 131 benefits from the heat dissipation from the base plane 120 so that the reliability and performance of the first semiconductor die 131 may be improved. In accordance with an embodiment, the thickness of the base plane 120 is in a range from 5 um to 50 um. It should be noted that the range of the thickness of the base plane is selected purely for demonstration purposes and are not intended to limit the various embodiments of the present disclosure to any particular thickness. One of ordinary skill in the art would recognize many variations, alternatives, and modifications.

It should further be noted that one of ordinary skill in the art would recognize the stacking structure of the multi-die semiconductor device 100 may have variations, alternatives, and modifications. For example, the second semiconductor die 132 may be face-to-face attached to the first semiconductor die 131 using a plurality of metal bumps (not shown) Likewise, the third semiconductor die 133 can be flipped. As a result, there may be a face-to-face stacking structure between the third semiconductor die 133 and the second semiconductor die 132.

Figure 2A:
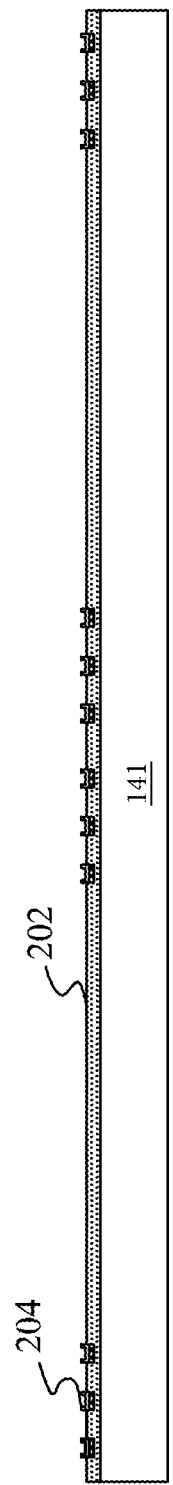
FIGS. 2A-2E are cross sectional views of intermediate stages in the making of a multi-chip semiconductor device in accordance with an embodiment.

FIGS. 2A-2E are cross sectional views of intermediate stages in the making of a multi-chip semiconductor device in accordance with an embodiment. FIG. 2A illustrates a cross sectional view of a wafer plane 141. As shown in FIG. 2A, the wafer plane 141 may further comprise a plurality of metal pads 204 whose connections are redistributed through a redistribution layer 202. The wafer plane 141 may comprise a plurality of first semiconductor dies such as 131. Furthermore, each first semiconductor die 131 may comprise active circuit layers, substrate layers, ILD layers and IMD layers (not shown). The metal pads 204 and the redistribution layer 202 provide various connection paths for the active circuit layers of the wafer plane 141.

Figure 2B:
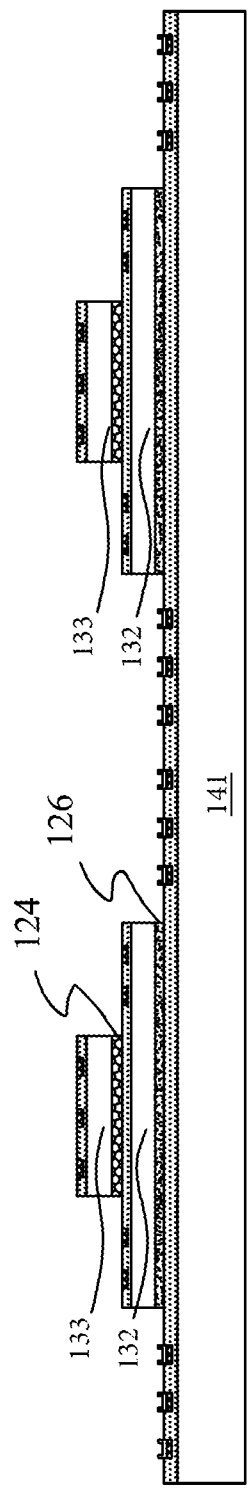

FIG. 2B illustrates the process of stacking the second semiconductor die 132 and the third semiconductor die 133 on top of the wafer plane 141. The backside of the second semiconductor die 132 is attached to the top side of the wafer plane 141 by employing a first adhesive 126 such as epoxy, thermal interface materials and/or the like. Likewise, the backside of the third semiconductor die 133 is attached to the top side of the second semiconductor die 132 by employing a second adhesive 124. It should be noted the second adhesive 124 may be the same as the first adhesive 126. Alternatively, the second adhesive 124 may differ from the first adhesive 126.

Figure 2C:
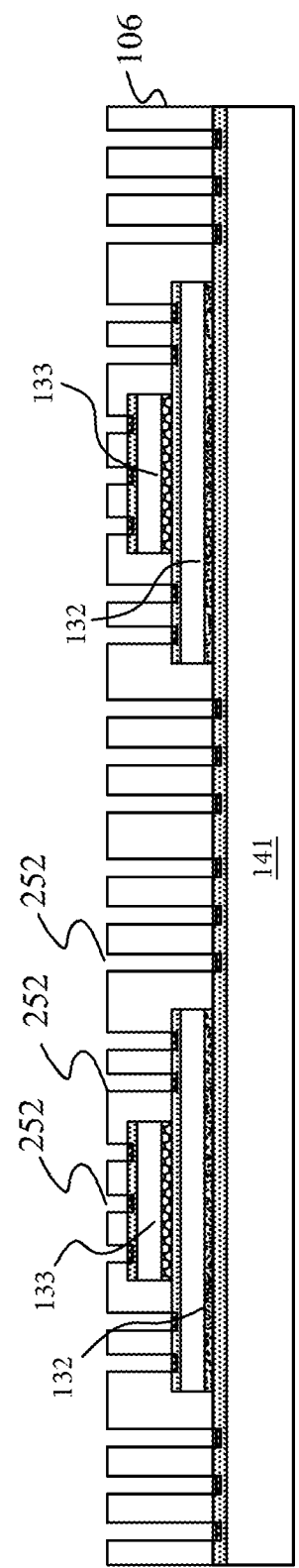

FIG. 2C illustrates a cross sectional view of a photo-sensitive material layer 106. The photo-sensitive material layer 106 is formed on top of the wafer plane 141. As shown in FIG. 2C, the second semiconductor die 132 and the third semiconductor die 133 are embedded in the photo-sensitive material layer 106. The photo-sensitive material may comprise polybenzoxazole (PBO), SU-8 photo-sensitive epoxy, film type polymer materials and/or the like.

FIG. 2C further illustrates a cross sectional view of forming a plurality of openings in the photo-sensitive material layer 106. In consideration of electrical and thermal needs, selective areas of the photo-sensitive material layer 106 are exposed to light. The physical properties of the photo-sensitive regions exposed to light change as a result. According to an embodiment, the change of the physical properties of the exposed regions will cause the exposed regions to be etched away when a developer solution is applied to the photo-sensitive material layer 106. As a result, a variety of openings 252 are formed. The formation of the openings 252 in the photo-sensitive material layer 106 involves lithography operations, which are well known, and hence are not discussed in further detail herein.

Figure 2D:
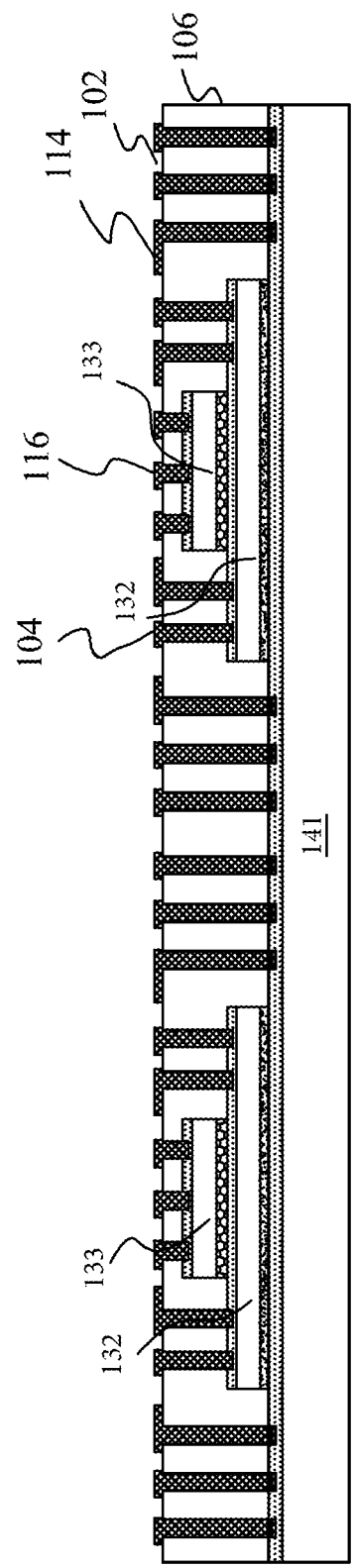

FIG. 2D illustrates the formation of a plurality of TAVs and a redistribution layer. As shown in FIG. 2D, a conductive material fills the openings 252 (not shown but illustrated in FIG. 2C) using an electrochemical plating process. As a result, a plurality of TAVs 102, 104 and 116 are formed in the photo-sensitive material layer 106. The conductive material may be copper, but can be any suitable conductive materials, such as copper alloys, aluminum, tungsten, silver and combinations thereof. In order to redistribute the electrical connections from the TAVs 102, 104 and 116, a first redistribution layer 114 may be formed on top of the photo-sensitive material layer 106. The first redistribution layer 114 may be formed by means of an electrochemical plating mechanism. It should be noted that the first redistribution layer 114 may be formed at the same time as the TAVs 102, 104 and 116. Alternatively, the first redistribution layer 114 may be formed after the TAVs 102, 104 and 116 are formed.

Figure 2E:
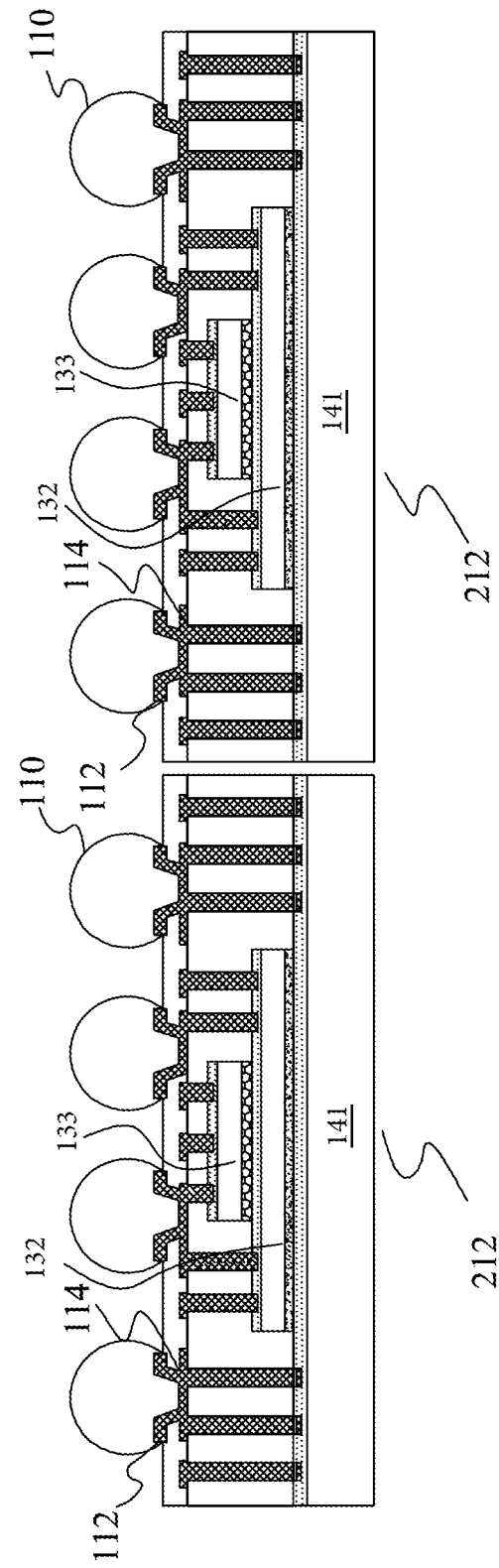

FIG. 2E illustrates the formation of a plurality of UBM structures and interconnection pads. The plurality of UBM structures 112 are formed on top of the redistribution layer 114. The UBM structures 112 may help to prevent diffusion between the solder balls and the integrated circuits of the multi-chip semiconductor device, while providing a low resistance electrical connection. The interconnection pads provide an effective way to connect the multi-chip semiconductor device with external circuits (not shown). The interconnection pads are I/O pads of the multi-chip semiconductor device. In accordance with an embodiment, the interconnection pads may be a plurality of solder balls 110. Alternatively, the interconnection pads may be a plurality of land grid array (LGA) pads. FIG. 2E further illustrates a process of separating the reconfigured wafer into a plurality of multi-die structures 212 using a dicing process. The dicing process is well known in the art, and hence is not discussed in detail herein.

Figure 3A:
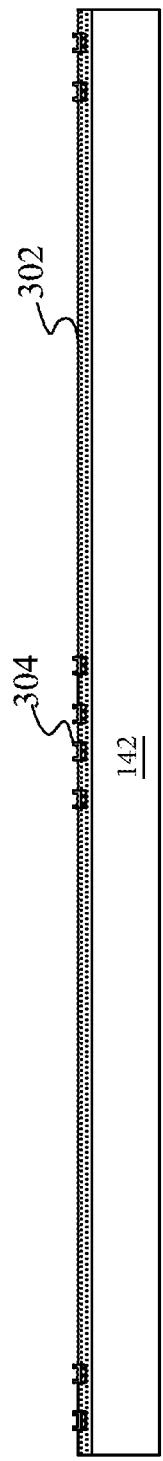
FIGS. 3A-3I are cross sectional views of intermediate stages in the making of a multi-chip semiconductor device in accordance with another embodiment.
Figure 3B:
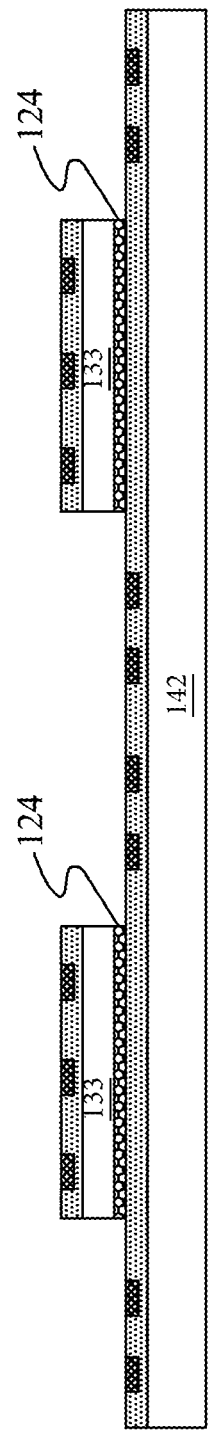

FIGS. 3A-3I are cross sectional views of intermediate stages in the making of a multi-chip semiconductor device in accordance with another embodiment. FIG. 3A illustrates a cross sectional view of placing a wafer plane 142. As shown in FIG. 3A, the wafer plane 142 may further comprise a plurality of metal pads 304 whose connections are redistributed through a redistribution layer 302. The wafer plane 142 may further comprise a plurality of second semiconductor dies 132. FIG. 3B illustrates the process of stacking the third semiconductor die 133 on top of the wafer plane 142. The backside of the third semiconductor die 133 is glued on the top side of the wafer plane 142 by employing the second adhesive 124.

Figure 3C:
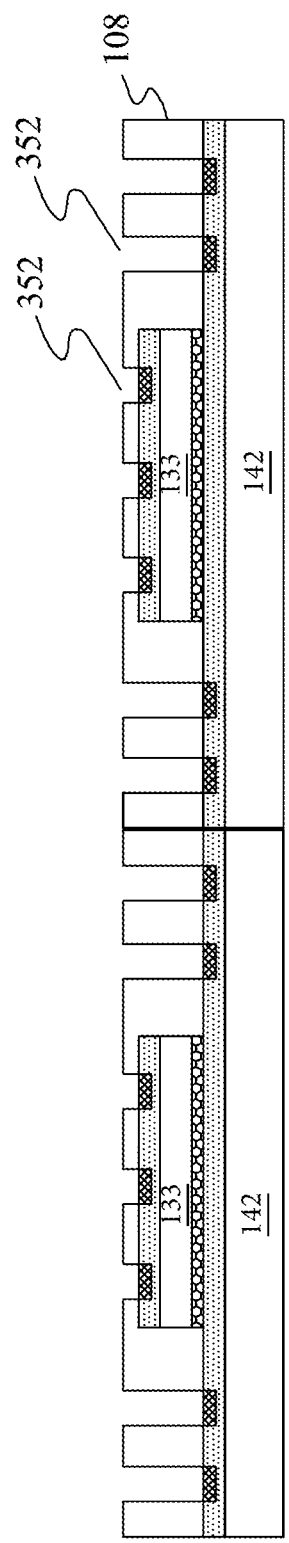

FIG. 3C illustrates a cross sectional view of a photo-sensitive material layer 108. The photo-sensitive material layer 108 is formed on top of the wafer plane 142. As shown in FIG. 3C, the third semiconductor die 133 is embedded in the photo-sensitive material layer 108. The photo-sensitive material may comprise polybenzoxazole (PBO), SU-8 photo-sensitive epoxy, film type polymer materials and/or the like. FIG. 3C further illustrates a cross sectional view of forming a plurality of openings 352 in the photo-sensitive material layer 108. The formation of the openings 352 in the photo-sensitive material layer 108 is similar to the formation of the opening 252 shown in FIG. 2C, and hence is not discussed in further detail to avoid repetition.

Figure 3D:
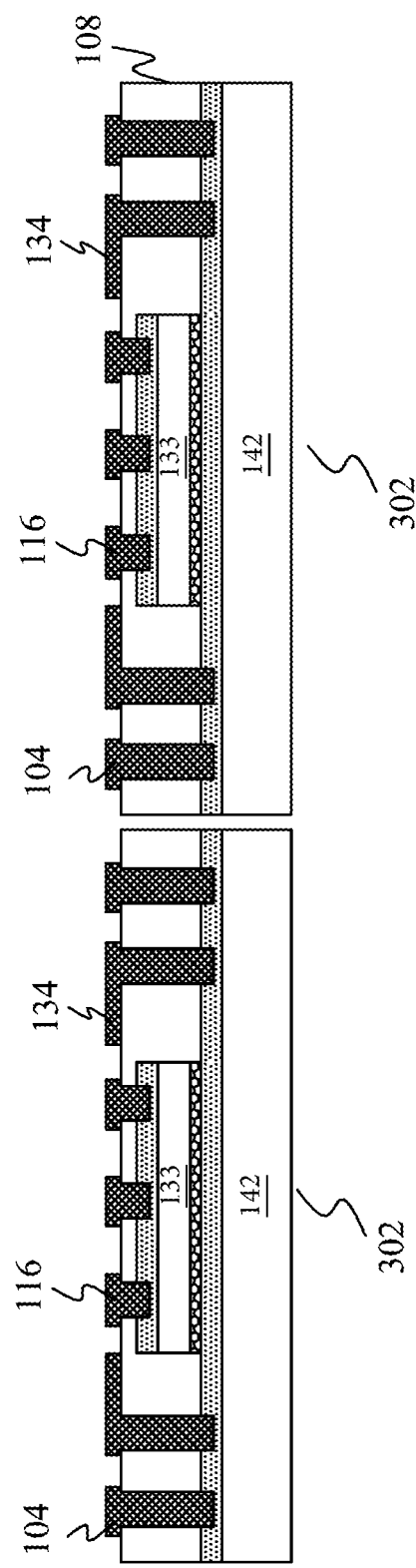

FIG. 3D illustrates the formation of a plurality of TAVs and a redistribution layer. As shown in FIG. 3D, both TAVs 104, 116 and the redistribution layer 134 may be formed by an electrochemical plating process, which has been described above with respect to FIG. 2D, and hence is not repeated again. FIG. 3D further illustrates a process of separating the reconfigured wafer into a plurality of multi-die structures 302 using a dicing process. The dicing process is well known in the art, and hence is not discussed in detail herein.

Figure 3E:
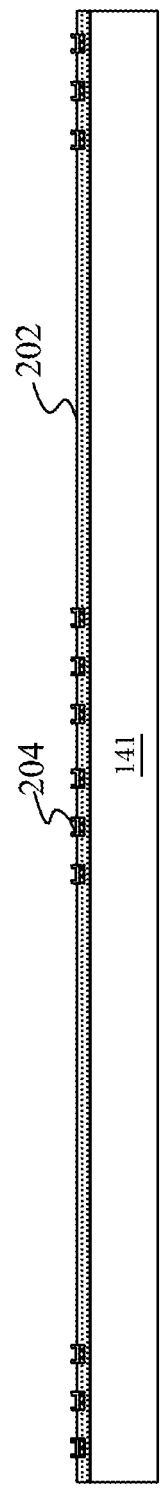
Figure 3F:
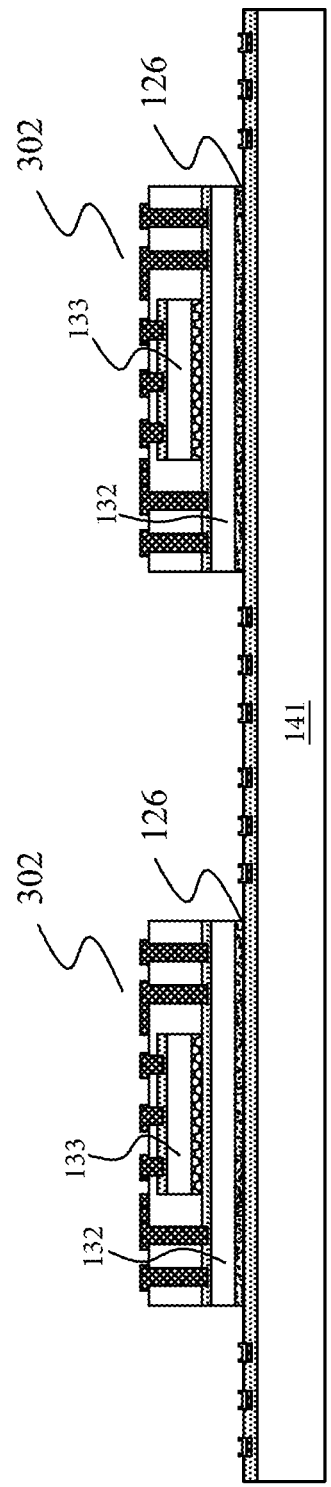

FIG. 3E illustrates a cross sectional view of a wafer plane 141. As shown in FIG. 3E, the wafer plane 141 may further comprise a plurality of metal pads 204 whose connections are redistributed through a redistribution layer 202. The wafer plane 141 may further comprise a plurality of first semiconductor dies 131. FIG. 3F illustrates the process of stacking the multi-die structures 302 on top of the wafer plane 141. The formation of the multi-die structure 302 has been described above with respect to FIG. 3D. As shown in FIG. 3D, the multi-die structure 302 has a top side with a photo-sensitive layer wherein the third semiconductor die 133 is embedded in the photo-sensitive layer. The backside of the multi-die structure 302 is glued on the top side of the wafer plane 141 by employing the first adhesive 126.

Figure 3G:
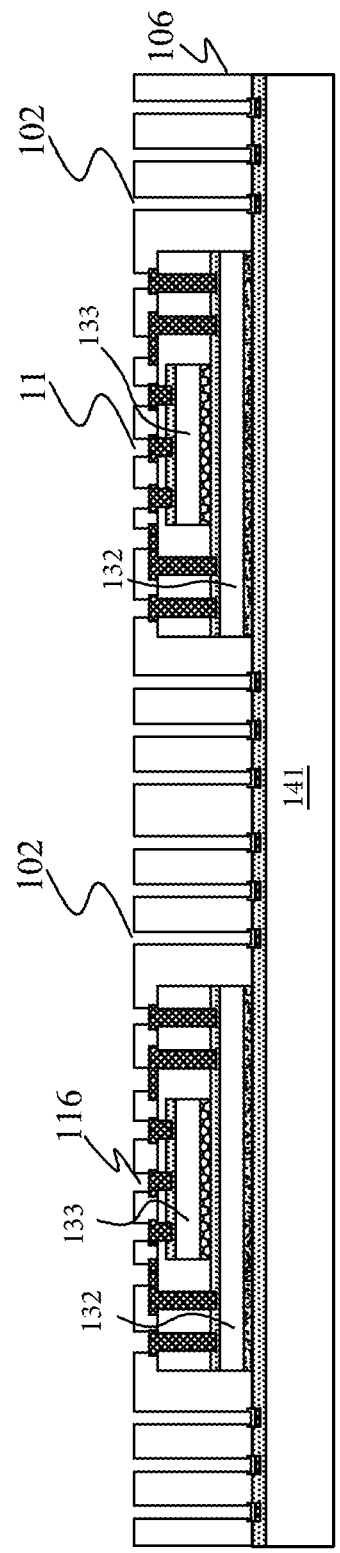

FIG. 3G illustrates a cross sectional view of a photo-sensitive material layer 106. The photo-sensitive material layer 106 is formed on top of the wafer plane 141. As shown in FIG. 3G, the second semiconductor die 132 and the third semiconductor die 133 are embedded in the photo-sensitive material layer 106. FIG. 3G further illustrates a cross sectional view of forming a plurality of openings in the photo-sensitive material layer 106. The process of forming a photo-sensitive material layer and the plurality of openings in the photo-sensitive material layer has been described above with respect to FIG. 2C, and hence is not discussed in detail in order to avoid repetition.

Figure 3H:
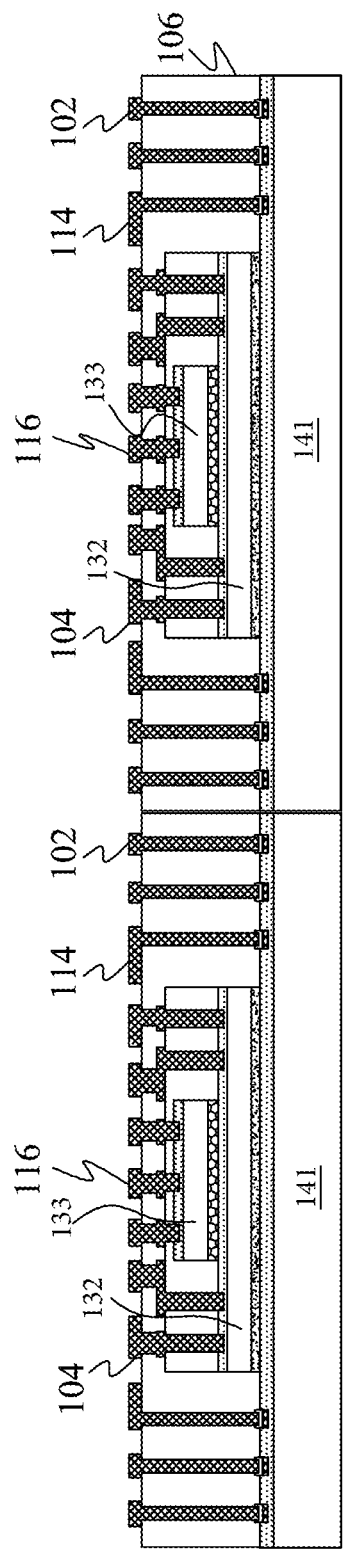
Figure 3I:
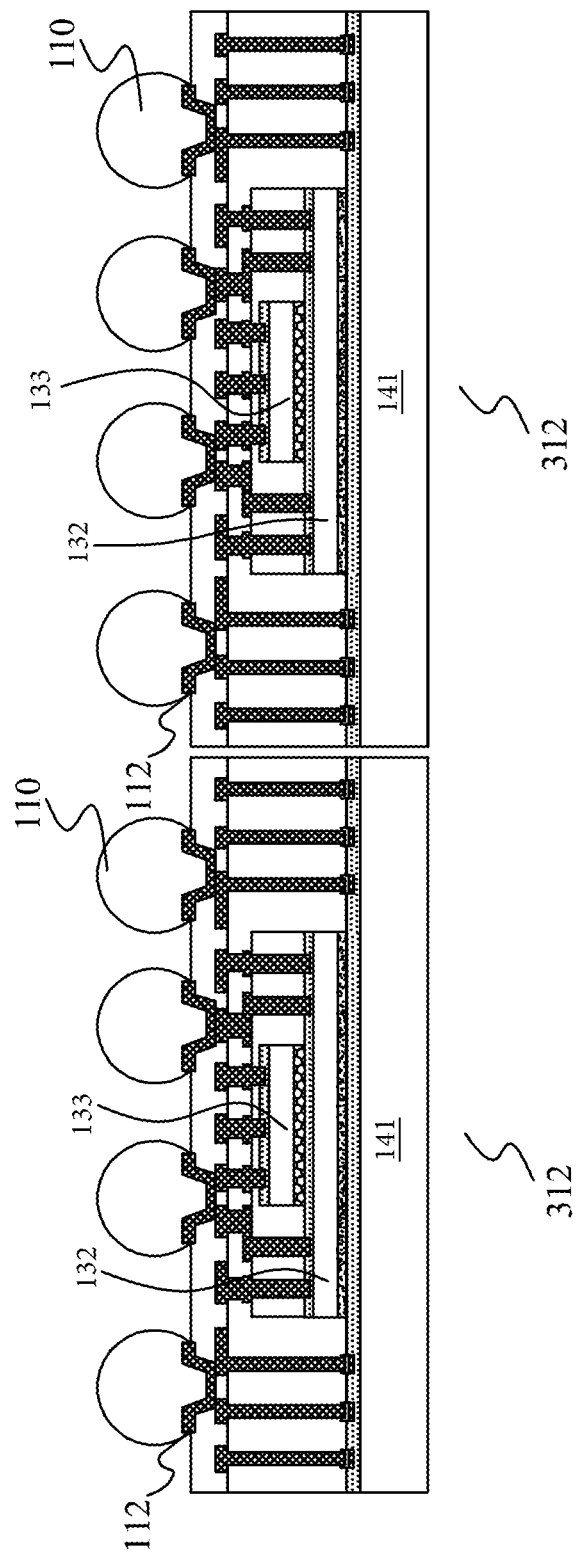

FIG. 3H illustrates the formation of a plurality of TAVs in the photo-sensitive material layer 106 and a redistribution layer on top of the photo-sensitive material layer 106. The processes of forming a plurality of TAVs and a redistribution layer in a photo-sensitive layer have been described above with respect to FIG. 2D, and hence are not discussed in further detail. FIG. 3I illustrates the formation of a plurality of UBM structures and interconnection pads. FIG. 3I further illustrates forming a plurality of multi-die structures 312 using a dicing process. The process of forming UBM structures and interconnection pads and separating the reconfigured wafer into the plurality of multi-die structures 312 are similar to that of FIG. 2E.

Figure 4A:
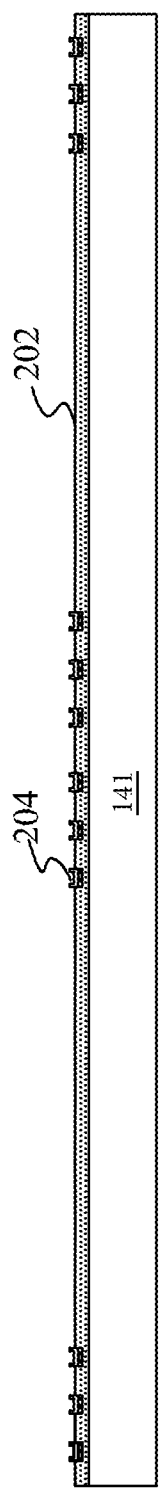
FIGS. 4A-4H are cross sectional views of intermediate stages in the making of a multi-chip semiconductor device in accordance with yet another embodiment.
Figure 4B:
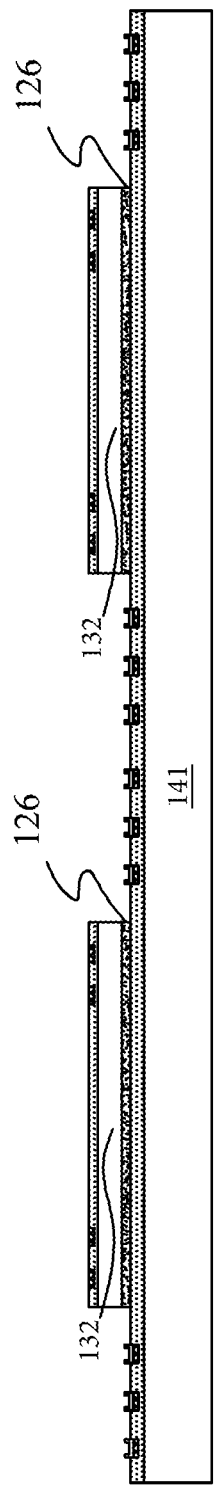

FIGS. 4A-4H are cross sectional views of intermediate stages in the making of a multi-chip semiconductor device in accordance with yet another embodiment. FIG. 4A illustrates a cross sectional view of a wafer plane 141, which is similar to that of FIG. 2A. FIG. 4B illustrates the process of stacking the second semiconductor die 132 on top of the wafer plane 141. The backside of the second semiconductor die 132 is glued on the top side of the first semiconductor die 131 by employing the first adhesive 126.

Figure 4C:
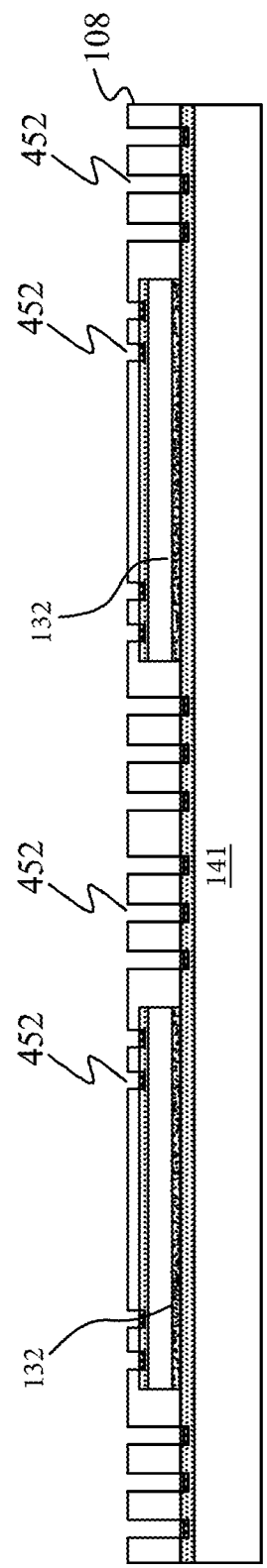

FIG. 4C illustrates a cross sectional view of a photo-sensitive material layer 108. The photo-sensitive material layer 108 is formed on top of the wafer plane 141. As shown in FIG. 4C, the second semiconductor die 132 is embedded in the photo-sensitive material layer 108. FIG. 4C further illustrates a cross sectional view of forming a plurality of openings 452 in the photo-sensitive material layer 108. The process of forming the plurality of openings 452 is similar to that of forming the openings 252 shown in FIG. 2C, and hence are not discussed in further detail herein.

Figure 4D:
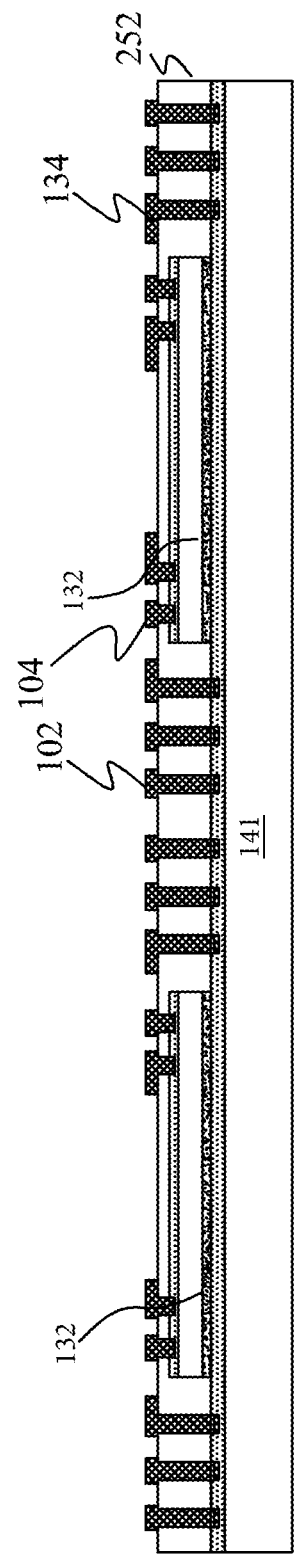
Figure 4E:
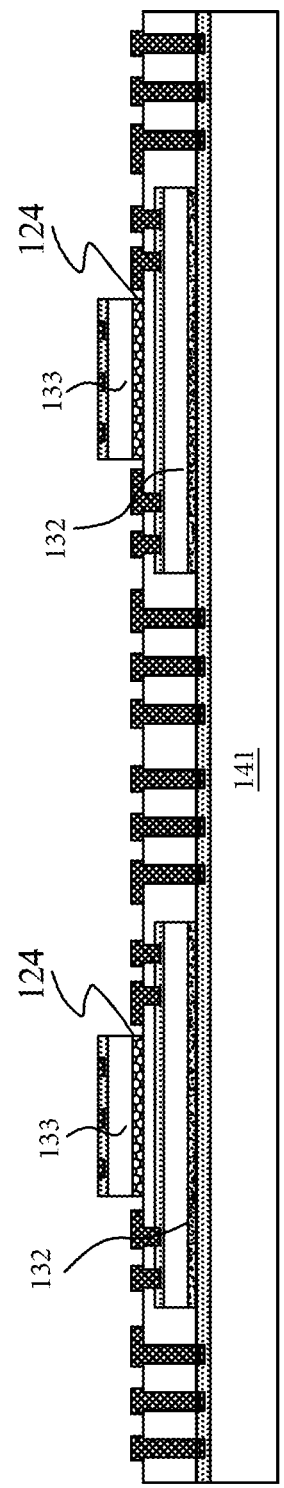

FIG. 4D illustrates the formation of a plurality of TAVs and a second redistribution layer. Similar to the process shown in FIG. 2D, a plurality of TAVs 102, 104 and the second redistribution layer 134 are formed by an electrochemical plating mechanism. FIG. 4E illustrates the process of stacking the third semiconductor die 133 on top of the photo-sensitive material layer 108. The backside of the third semiconductor die 133 is glued on top of the photo-sensitive material layer 108 by employing a second adhesive 124.

Figure 4F:
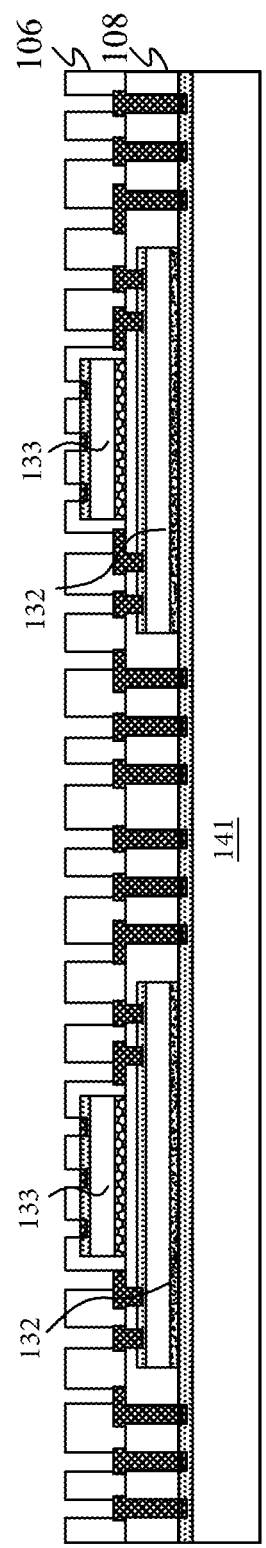
Figure 4G:
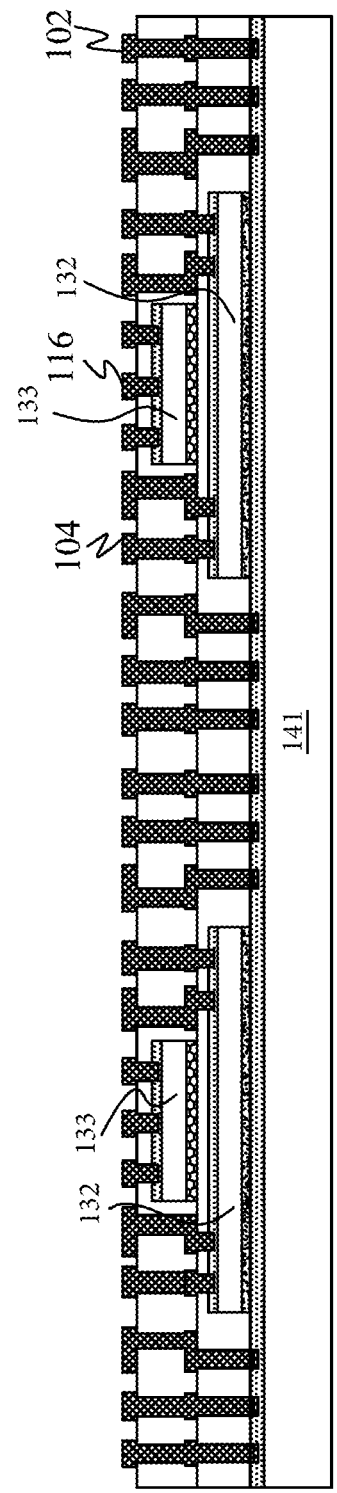

FIG. 4F illustrates a cross sectional view of a photo-sensitive material layer 106. The photo-sensitive material layer 106 is formed on top of the photo-sensitive material layer 108. As shown in FIG. 4F, the third semiconductor die 133 is embedded in the photo-sensitive material layer 106. The process of forming a photo-sensitive material layer and openings has been described above with respect to FIG. 2C, and hence is not discussed in detail in order to avoid repetition. FIG. 4G illustrates a cross sectional view of forming a plurality of TAVs in the photo-sensitive material layer 106. The process of forming TAVs 102, 104, 106 is similar to that shown in FIG. 2D.

Figure 4H:
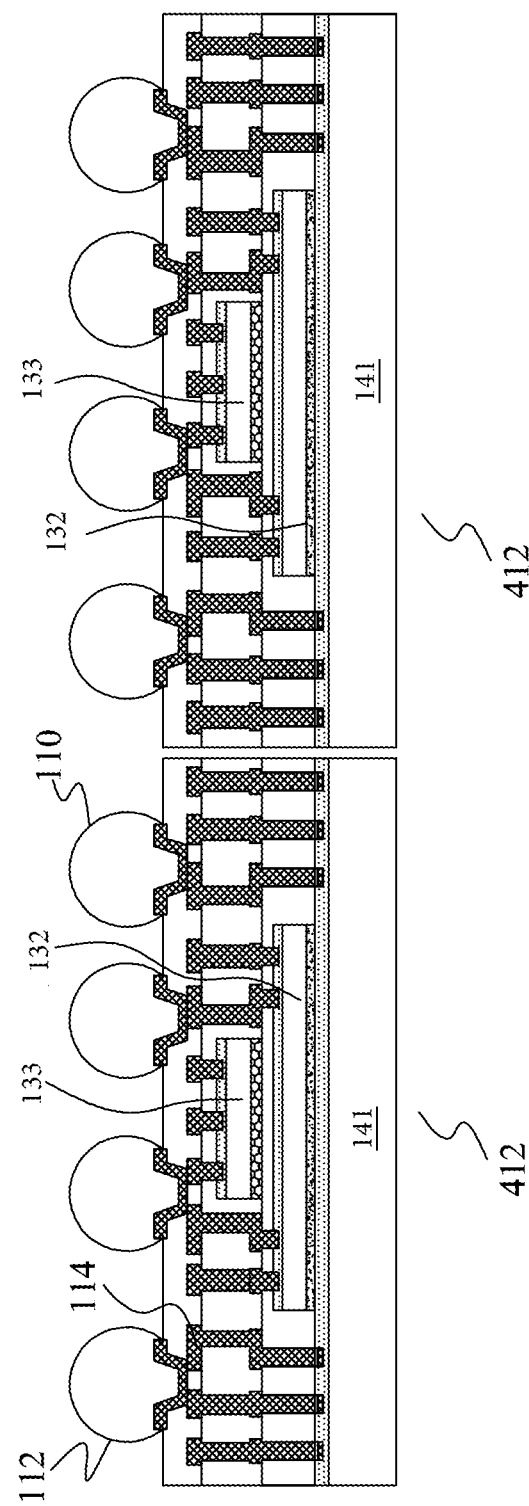

FIG. 4H illustrates the formation of a plurality of UBM structures and interconnection pads. The plurality of UBM structures are formed between the redistribution layer 114 and the solder balls 110. FIG. 4H further illustrates a process of separating the reconfigured wafer into a plurality of multi-die structures 412 using a dicing process. The dicing process is well known in the art, and hence is not discussed in detail herein.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   attaching a plurality of first semiconductor dies to a top side of a first wafer, the first wafer comprising a plurality of second semiconductor dies;
   depositing a first photo-sensitive material layer over the top side of the first wafer, wherein the plurality of first semiconductor dies are surrounded by the first photo-sensitive material layer, wherein the first photo-sensitive material layer covers top surfaces of the plurality of first semiconductor dies;
   forming a plurality of first openings in the first photo-sensitive material layer by exposing the first photo-sensitive material layer to light and developing the first photo-sensitive material layer;
   plating a first conductive material in the plurality of first openings to form a first group of through assembly vias in the first photo-sensitive material layer and a plurality of first redistribution layers on top of the first photo-sensitive material layer;
   dicing the first wafer to form a plurality of first packages, each of the plurality of first packages comprising at least one of the plurality of first semiconductor dies and at least one of the plurality of second semiconductor dies;
   attaching at least one of the plurality of first packages to a top side of a second wafer, the second wafer comprising a plurality of third semiconductor dies;
   depositing a second photo-sensitive material layer over the top side of the second wafer, wherein the second photo-sensitive material layer surrounds the at least one of the plurality of first packages, and covers sidewalls and top surfaces of the first photo-sensitive material layer of the at least one of the plurality of first packages;
   forming a plurality of second openings in the second photo-sensitive material layer by exposing the second photo-sensitive material layer to light and developing the second photo-sensitive material layer; and
   plating a second conductive material in the plurality of second openings to form a second group of through assembly vias in the second photo-sensitive material layer and a plurality of second redistribution layers on top of the second photo-sensitive material layer.

2. The method of claim 1, wherein the first group of through assembly vias comprises:
   a first via formed between a top surface of the plurality of first semiconductor dies and a top surface of the first photo-sensitive material layer; and
   a second via formed between a top surface of the first wafer and the top surface of the first photo-sensitive material layer.

3. The method of claim 1, wherein the second group of through assembly vias comprises:
   a third via formed between a top surface of the at least one of the plurality of first packages and a top surface of the second photo-sensitive material layer; and
   a fourth via formed between a top surface of the second wafer and the top surface of the second photo-sensitive material layer.

4. The method of claim 1, wherein:
   the attaching the first plurality of semiconductor dies comprises attaching the first plurality of semiconductor dies to the first wafer using a first adhesive layer; and
   the attaching the at least one of the plurality of first packages comprises attaching the at least one of the plurality of first packages to the second wafer using a second adhesive layer.

5. The method of claim 1, wherein:
   the plurality of first redistribution layers and the first group of through assembly vias are formed in a single plating process.

6. The method of claim 1, wherein:
   the plurality of second redistribution layers and the second group of through assembly vias are formed in a single plating process.

7. The method of claim 1, further comprising:
   forming under bump metallization (UBM) structures over the plurality of second redistribution layers; and
   forming connectors over the UBM structures.

8. The method of claim 7, further comprising dicing the second wafer to form a plurality of second packages, each of the plurality of second packages comprising at least one of the plurality of first packages and at least one of the plurality of third semiconductor dies.

9. A method comprising:
   attaching a first semiconductor die to an upper side of a first wafer comprising at least one second semiconductor die;
   forming a first reconfigured wafer by embedding the first semiconductor die into a first photo-sensitive material layer, the first photo-sensitive material layer covering sidewalls of the first semiconductor die and an upper surface of the first semiconductor die distal the first wafer;
   forming a plurality of first openings in the first photo-sensitive material layer by exposing the first photo-sensitive material layer to light and developing the first photo-sensitive material layer;
   plating a first conductive material in the plurality of first openings to form a first group of through assembly vias in the first photo-sensitive material layer and a plurality of first redistribution layers on the first photo-sensitive material layer, wherein the first redistribution layers and the first group of through assembly vias are formed in a single plating process;

attaching the first reconfigured wafer to an upper side of a second wafer comprising at least one third semiconductor die;

depositing a second photo-sensitive material layer over the upper side of the second wafer to form a second reconfigured wafer, wherein the second photo-sensitive material layer surrounds the first reconfigured wafer and extends along sidewalls and upper surfaces of the first photo-sensitive material layer;

forming a plurality of second openings in the second photo-sensitive material layer by exposing the second photo-sensitive material layer to light and developing the second photo-sensitive material layer; and plating a second conductive material in the plurality of second openings to form a second group of through assembly vias in the second photo-sensitive material layer and a plurality of second redistribution layers on the second photo-sensitive material layer, wherein the second redistribution layers and the second group of through assembly vias are formed at a same time.

10. The method of claim 9, further comprising:
depositing a dielectric layer over the second photo-sensitive material layer;
forming a plurality of under bump metallization structures in the dielectric layer; and
forming a plurality of solder balls on top of the plurality of under bump metallization structures.

11. The method of claim 10, further comprising:
after the step of forming the plurality of solder balls, sawing the second reconfigured wafer into a plurality of packages; and
attaching a backside of a package to a base plane using an adhesive layer, wherein the base plane is a heat sink.

12. The method of claim 11, wherein:
a thickness of the heat sink is in a range from 5 um to 50 um.

13. The method of claim 9, wherein:
the first group of through assembly vias comprises:
    a first via and a second via formed between a top surface of the first semiconductor die and a top surface of the first photo-sensitive material layer; and
    a third via and a fourth via formed between a top surface of the first wafer and the top surface of the first photo-sensitive material layer; and
the second group of through assembly vias comprises:
    a fifth via, a sixth via, a seventh via and an eighth via formed between the top surface of the first photo-sensitive material layer and a top surface of the second photo-sensitive material layer; and
    a ninth via formed between a top surface of the second wafer and the top surface of the second photo-sensitive material layer.

14. The method of claim 13, wherein:
the fifth via is vertically aligned with the first via;
the sixth via is connected to the second via through a first interconnect structure;
the seventh via is vertically aligned with the third via; and
the eighth via is connected to the fourth via through a second interconnect structure.

15. A method comprising:
attaching a first semiconductor die and a second semiconductor die to a top side of a first wafer, the first wafer comprising a third semiconductor die and a fourth semiconductor die;
forming a first reconfigured wafer by covering the first semiconductor die and the second semiconductor die with a first photo-sensitive material layer disposed on the top side of the first wafer;
forming a first group of through assembly vias in the first photo-sensitive material layer by exposing the first photo-sensitive material layer to light and etching away exposed portions of the first photo-sensitive material layer through a developer solution applied to the first photo-sensitive material layer;
dicing the first reconfigured wafer to form a first package comprising the first semiconductor die and the third semiconductor die, and a second package comprising the second semiconductor die and the fourth semiconductor die;
attaching the first package and the second package to a top side of a second wafer comprising a fifth semiconductor die and a sixth semiconductor die;
forming a second photo-sensitive material layer on the top side of the second wafer, thereby forming a second reconfigured wafer, wherein top surfaces and sidewalls of the first and the second packages are covered by the second photo-sensitive material layer; and
forming a second group of through assembly vias in the second photo-sensitive material layer.

16. The method of claim 15, further comprising:
attaching the second wafer to a base plane, wherein the base plane is a heat sink having a thickness in a range from 5 um to 50 um.

17. The method of claim 15, further comprising:
attaching the first reconfigured wafer to the second wafer using a first adhesive layer;
attaching the first semiconductor die to the first wafer using a second adhesive layer;
forming a first redistribution layer on top of the first photo-sensitive material layer;
forming a second redistribution layer on top of the second photo-sensitive material layer; and
forming a plurality of solder balls on top of the second redistribution layer.

18. The method of claim 15, further comprising:
face-to-face attaching the first semiconductor die to the first wafer using a plurality of metal bumps.

19. The method of claim 15, further comprising:
interconnecting the first group of through assembly vias and the second group of through assembly vias.

20. The method of claim 15, further comprising dicing the second reconfigured wafer to form a third package comprising the first package and the fifth semiconductor die, and a fourth package comprising the second package and the sixth semiconductor die.

* * * * *